United States Patent
Berberich

(10) Patent No.: US 7,085,142 B2
(45) Date of Patent: Aug. 1, 2006

(54) ELECTRICAL DEVICE

(75) Inventor: Reinhold Berberich, Frankfurt (DE)

(73) Assignee: Siemens Aktiengesellschaft, München (DE)

( * ) Notice: Subject to any disclaimer, the term of this patent is extended or adjusted under 35 U.S.C. 154(b) by 269 days.

(21) Appl. No.: 10/448,945

(22) Filed: May 30, 2003

(65) Prior Publication Data

US 2004/0027819 A1 Feb. 12, 2004

(30) Foreign Application Priority Data

May 31, 2002 (DE) .............................. 102 24 221

(51) Int. Cl.
*H05K 9/00* (2006.01)

(52) U.S. Cl. .................................... 361/818

(58) Field of Classification Search ........ 361/816–818; 174/35 R; 439/607–610; 228/179.1; 333/185
See application file for complete search history.

(56) References Cited

U.S. PATENT DOCUMENTS

| | | | | |
|---|---|---|---|---|
| 4,267,528 A | * | 5/1981 | Thornberry ................. | 333/12 |
| 4,370,515 A | * | 1/1983 | Donaldson ................ | 174/35 R |
| 5,160,807 A | * | 11/1992 | Fry et al. ................. | 174/35 R |
| 5,206,796 A | * | 4/1993 | Thompson et al. ......... | 361/818 |
| 5,428,508 A | * | 6/1995 | Pronto ....................... | 361/818 |
| 5,717,577 A | * | 2/1998 | Mendolia et al. ........... | 361/818 |
| 6,157,546 A | * | 12/2000 | Petty et al. ................. | 361/816 |
| 6,239,359 B1 | * | 5/2001 | Lilienthal et al. ......... | 174/35 GC |
| 6,448,873 B1 | * | 9/2002 | Mostov ....................... | 333/185 |

FOREIGN PATENT DOCUMENTS

DE        35 20 531 A1    12/1986

\* cited by examiner

*Primary Examiner*—Randy W. Gibson
*Assistant Examiner*—Ivan Carpio
(74) *Attorney, Agent, or Firm*—Cohen, Pontani, Lieberman & Pavane

(57) ABSTRACT

An electrical device includes an electrically conductive shielding element which is positioned on a mounting substrate on which electronic components of an electric module are mounted. The mounting substrate has a conductor track structure for electrically connecting the electronic components of the electronic module and for connecting the module to other modules. The shielding element is formed so as to shield against electromagnetic radiation. At least one electrical conductor track forming a loop is formed around at least one component to be shielded on the mounting substrate, defines a boundary between the region with no electromagnetic shielding and the shielded region, and is connected to a fixed electric potential. At least one cutout is formed in the surface of the conductor track and of the mounting substrate therebelow. At least one latching mechanism is formed on the shielding element engaging in the at least one cutout, as a result of which the shielding element is connected to the fixed electric potential.

19 Claims, 3 Drawing Sheets

ELECTRICAL DEVICE

BACKGROUND OF THE INVENTION

1. Field of the Invention

The invention relates to an electrical device having electronic components or modules, the electrical device also having an electrically conductive shielding element which is positioned on a mounting substrate on which the electronic components are mounted, the mounting substrate having a conductor track structure for electrically interconnecting the electronic components, the shielding element being formed to shield against electromagnetic radiation.

2. Description of the Related Art

To ensure satisfactory functioning of electronic equipment, the equipment must be shielded against electromagnetic interference radiation, especially that which occurs in the radio-frequency range. This shielding is generally achieved by surrounding the electronic components or modules with an electrically conductive and grounded casing.

Enclosing the electrical or electronic components and modules in a metallic casings is complex and expensive since the shielding elements have to be mechanically fixed in a complex manner and electrically contacted, usually by soldering or welding the shielding elements to the metallic structures on the substrate.

German reference No. DE 3520531 A1 discloses electromagnetic shielding for printed circuit boards. The printed circuit boards are shielded by positioning plastic box-like supplementary elements on the printed circuit board. The supplementary elements have a metallized surface for shielding against electromagnetic influences and are connected to printed conductor tracks on the printed circuit board. A connection is made, by plated-through conductor tracks, to the supplementary elements which have been provided for shielding purposes and arranged on the opposite side of the printed circuit board.

SUMMARY OF THE INVENTION

The object of the present invention is to provide an electrical device having electromagnetic shielding which is to be fixed using simple mechanical means and is to be electrically contacted.

The object is achieved according to the invention by at least one electrical conductor track forming a loop on the mounting substrate around at least one component to be shielded on the mounting substrate, the loop forming a boundary between a region with no electromagnetic shielding and a region to be shielded and being connected to a fixed electric potential. At least one cutout is formed in the surface of the conductor track and of the mounting substrate therebelow and at least one latching mechanism is formed on the shielding element engaging in the at least one cutout, as a result of which the shielding element is connected to the fixed electric potential.

The latching mechanisms on the shielding element and the cutouts in the substrate allow a rapid, reliable and low-complexity electrical connection to be made between the closed conductor track which has been applied to the substrate and the shielding element. The electrical contacting of the shielding element with the fixed potential and the permanent mechanical connection between the shielding element and the substrate are both accomplished by performing only one process step.

The latching mechanisms on the shielding element may be press-in contacts which are pressed into the corresponding cutouts in the mounting substrate. Press-in contacts may be used, particularly when producing large numbers of cutouts and latching mechanisms, to create a rapid and reliable connection between the shielding element and the substrate.

For the purpose of creating a rapid and reliable connection, the press-in contacts formed on the shielding element need only be positioned on the corresponding cutouts in the region of the conductor track on the mounting substrate and pressed into the cutouts with a predetermined force. When the press-in contacts are pushed in, cold welding occurs between the contacts and the associated cutouts, which creates a reliable mechanical and electrical contact.

The latching mechanisms on the shielding element may also be flexible pins which are pushed through the corresponding hole-like cutouts in the mounting substrate and then bent back. These pins can be guided through the cutouts with very little force and the pin can be bent back in a very simple process step which can easily be performed by machine.

An alternative to this is for the flexible pins on the shielding element to be in the form of flexible, flat and tab-shaped strips which are pushed through the corresponding slot-like cutouts in the mounting substrate and then bent back. These tab-shaped latching mechanisms can easily be bent back in the bending direction although they are very stable in all other directions. Furthermore, tab-shaped latching mechanisms can easily be stamped out of a metal sheet. Instead of a rectangular shape, the flat and tab-shaped latching mechanisms may also have complex shapes, given appropriate requirements, such as, for example, the shape of an anchor or of a drop projected into a plane.

The mounting substrate may be a multilayer printed circuit board. In multilayer printed circuit boards, conductor tracks are guided in various planes. The conductor tracks in the various planes are electrically isolated from one another by the isolating layers arranged between the planes. This allows various electric circuits performing different functions to be created in the various planes. The signal-carrying conductor tracks are typically placed in an inner conducting plane of the multilayer printed circuit board and the grounded conductor tracks are located on the outer conducting planes of the multilayer printed circuit board. Multilayer printed circuit boards allow a very flexible design of the conductor track structures.

Furthermore, a filter device may be integrated in the multilayer printed circuit board. The filter device is a capacitor which is formed from a first conductor area connected, by a first conductor track structure, to a fixed first electric potential, and a second conductor area which is electrically isolated from the first conductor area and is connected, by a second conductor track structure, to a second electric potential which is not necessarily fixed. The first and second conductor areas are arranged approximately opposing one another to form a capacitance therebetween. During operation of the electrical device, electrical signals must be carried by conductor tracks from the unshielded region into the shielded region and vice versa. However, these conductor tracks may pick up electromagnetic interference signals and pass them on to the sensitive electronics in the shielded region. With the disclosed configuration of the invention, the radio-frequency interference signals present on the signal conductor track are conducted through a capacitor, i.e., the filter device, causing them to be conducted away to ground, as a result of which they do not reach the shielded region. Lines carrying electrical signals between the shielded and the unshielded region are sustainably rendered free from interference by the multilayer capacitor structure integrated in printed circuit board, which ensures reliable signal processing in the electrical device.

In a further embodiment, the mounting substrate comprises two parts, a first part substrate accommodating the components to be shielded, which are completely surrounded by the shielding element, and a second part substrate accommodating all of the unshielded components. The first part substrate is connected to the second part substrate by electrical and mechanical connecting elements. This has the advantage that only those components which need to be are provided with electromagnetic shielding. The two-part construction of the mounting substrate enables the components with different electromagnetic protection requirements to be combined easily and placed, prior to fabrication, on the respective part substrates before the whole device is formed by connecting the two part substrates.

The connecting element for electrically and mechanically connecting the two part substrates may be formed on a single side of the first part substrate in the manner of a plug, and for means for accommodating the plug-like connecting element to be provided on a single side of the second part substrate. This configuration enables the two part substrates to be joined together simply by being plugged together. Accordingly, complex process steps like soldering or welding are not required for connecting the elements to one another.

A device casing encloses the entire substrate and the shielding elements. The device casing protects the entire substrate, and the electronic components located on it, against environmental influences such as dirt and spray water. The casing may also be designed such that it additionally protects against electromagnetic interference, provided it is made of an electrically conductive material.

The device casing may be made of plastic. Plastic casings can be manufactured particularly cost-effectively and their weight contributes only slightly to the weight of the whole device.

Electronic components which are particularly sensitive electromagnetically may be protected individually by arranging shielding elements above and below the electronic components. If the substrate has electronic components fitted on both sides in the region to be electromagnetically shielded, then it is necessary to arrange shielding elements according to the invention on both side of the substrate.

If the substrate has electronic components fitted on one side, electonic components which are particularly sensitive electromagnetically may be protected individually by providing a shielding element on the component side of the substrate and by a metallized substrate performing the shielding function on the other side. Metallizing the non-component side of the substrate achieves a cost-effective electromagnetic shielding.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 1:
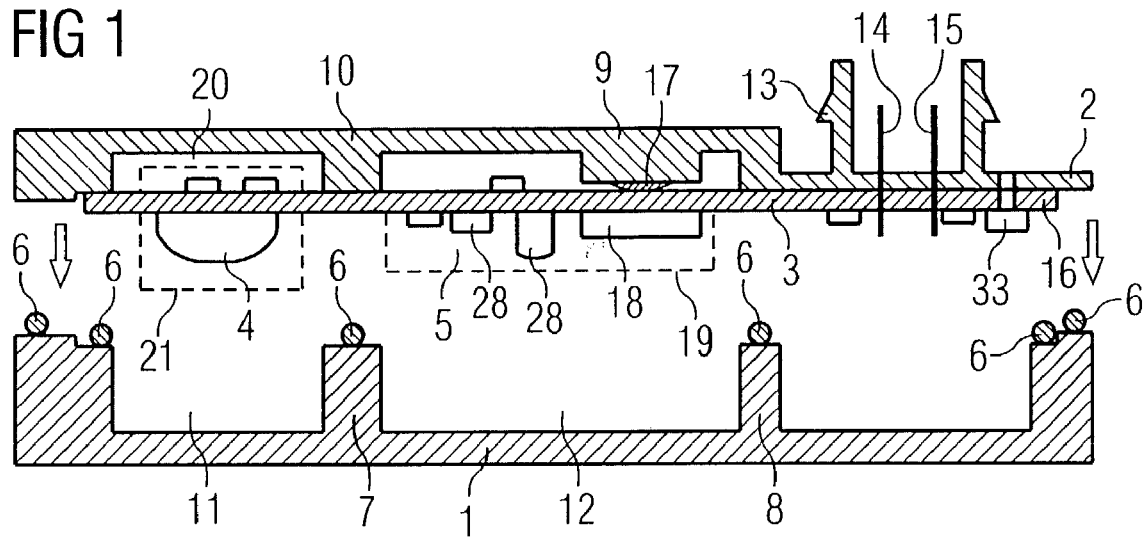
FIG. 1 is a sectional view of an electrical control device for a motor vehicle according to the present invention.

FIG. 1 shows a electrical device such as is usually used in motor vehicles. It may be a control device for a motor vehicle which has signal-processing electronics which are known to be very susceptible to interference from electromagnetic radiation at high frequencies. It is, however, also conceivable for the electrical device to be a sensor device which has, in addition to the actual sensor, a signal-conditioning circuit and/or a signal evaluation circuit arranged on one or more printed circuit boards.

The electrical device has a cup-shaped device casing 1 which is closed by a device casing cover 2. The device casing 1 protects signal-conditioning electronics 5, which includes electronic components 18, 28, and sensor 4, primarily against mechanical influences and against damage due to spray water. A multilayer printed circuit board 3, on which the sensor 4 and the signal conditioning electronics 5 for the sensor 4 are mounted, is arranged within the device casing 1. The sensor 4 and the signal-conditioning electronics 5 are very sensitive to interfering electromagnetic radiation and are protected from it by suitable shielding elements 19, 20, 21. The electrically conductive shielding elements 19, 20, 21 for protecting sensitive electronic components 18, 28 are indicated by the dashed lines in this drawing. Each of the electronic components 18, 28 may comprise modules including integrated circuits containing multiple subcomponents.

The device casing 1 and device casing cover 2 are sealed off from one another by a conductive rubber seal 6. The device casing 1 has two bars 7, 8 projecting into the casing interior. This forms two chambers 11, 12, the sensor 4 being located in one chamber 11 and the signal-conditioning electronics 5 being located in another chamber 12. A base 10 provides mechanical support for the multilayer printed circuit board 3.

A bar in the device casing cover 2 serves as a cooling dome 9 which is in thermal contact with the printed circuit board 3 by a thermally conductive adhesive 17. Electronic component 18 is a power module for the signal-conditioning electronics 5 and is arranged on a side of the printed circuit board 3 which is opposite the cooling dome 9. The power loss of this electronic component 18 is dissipated to the surroundings via the cooling dome 9.

A plug 13 is also arranged on the device casing cover 2. The plug 13 includes plug pins 14, 15 which protrude through the device casing cover 2 and are contacted in an end region 16 of the printed circuit board 3. The plug pins 14, 15 connect, by conducting planes of the multilayer printed circuit board 3, the signal-conditioning electronics 5 and/or the sensor 4 to electronic equipment in the motor vehicle. The plug pins 14, 15 supply electric signals and electrical power for the sensor 4 and signal-conditioning electronics 5 located in the interior of the casing.

Figure 2:
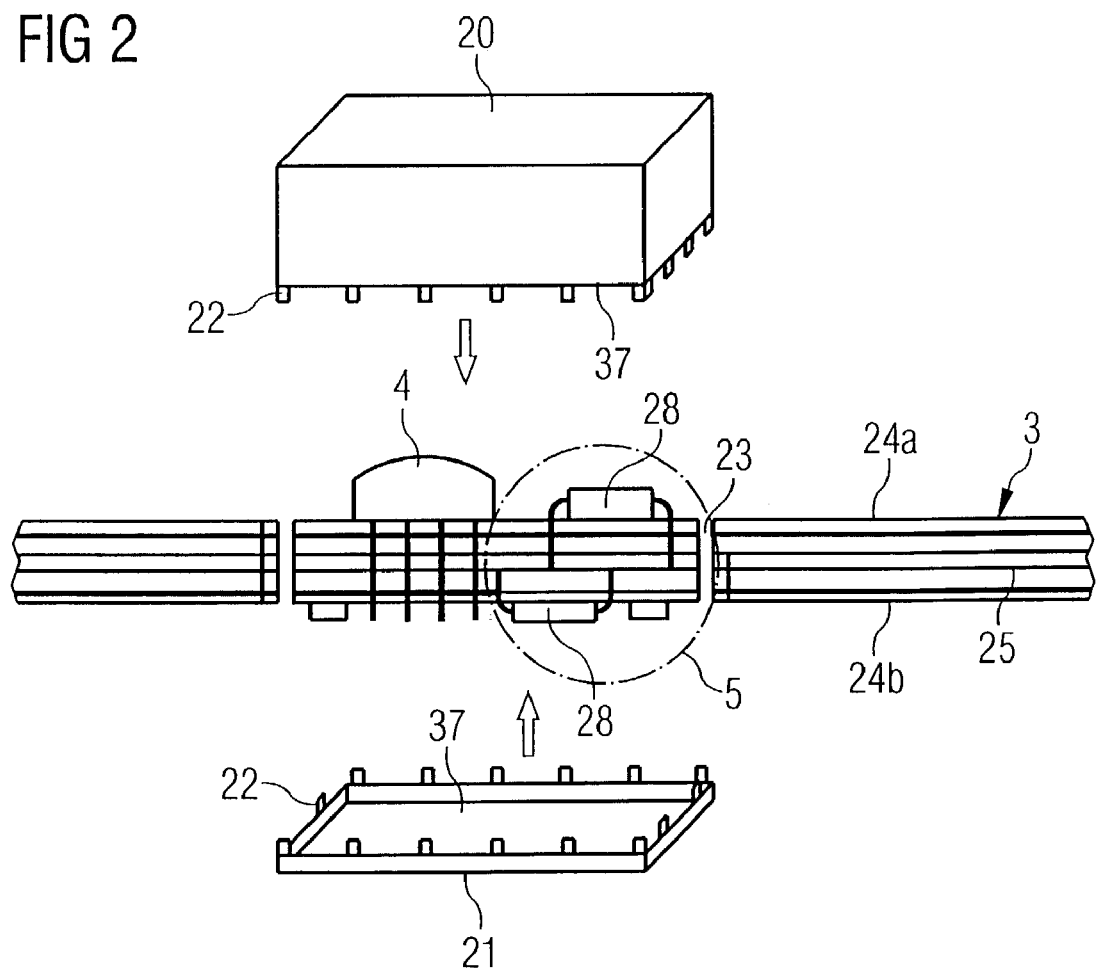
FIG. 2 is a partial sectional view of an assembled multilayer printed circuit board of the device in FIG. 1 provided with cutouts and a perspective view of shielding elements to be arranged on the circuit board.

FIG. 2 depicts the assembled multilayer printed circuit board 3 provided with cutouts 23 and shows two of the metallic shielding elements 20, 21. The multilayer printed circuit board 3 comprises a signal-carrying layer 25 with conductor tracks for carrying the signals measured by the sensor 4 to the signal-conditioning electronics 5. The signal-carrying layer 25 is also used to feed the supply voltages to the components and pass on the signals processed in the signal-conditioning electronics 5 for further use. The grounded conductor tracks are arranged on the grounded layers 24a, 24b of the multilayer printed circuit board 3. The grounded conductor tracks provide a fixed electrical reference potential which ideally remains completely constant over the whole of the ground conductor track. The upper shielding element 20 is connected to the grounded conductor track on the upper grounded layer 24a of the multilayer printed circuit board 3 and the lower shielding element 21 is similarly connected to the grounded conductor track on the lower grounded layer 24b of the multilayer printed circuit board 3. The edges 37 of the shielding elements 20, 21 sit completely on the grounded conductor tracks of the grounded layers 24a, 24b, respectively, as a result of which an electrical contact is produced between the edges 37 of the shielding elements 20, 21 and the grounded conductor tracks.

For simple connection of the metallic shielding elements 20, 21 to the multilayer printed circuit board 3, latching mechanisms 22 are formed on the shielding elements 20, 21 with corresponding cutouts 23 provided on the multilayer printed circuit board 3. These cutouts 23 may be drilled holes of the required diameter and of suitable depth or may be longitudinal holes or slots. In a specific application, both blind holes and through-holes may advantageously be used. The latching mechanisms 22 on the shielding elements 20, 21 are in electrical contact with the grounded conductor tracks formed on the multiplayer printed circuit board 3 by connection with metallized inner walls of the cutouts 23. The latching mechanisms 22 simultaneously perform the function of mechanically joining the shielding elements 20, 21 to the multilayer printed circuit board 3 and providing electrical contact between the shielding elements 20, 21 and the grounded conductor tracks. The latching mechanisms 22 in FIG. 2 are shown as pins which are tab-shaped. These pins may be inserted in cutouts 3 which are through-holes and then bent back to secure the shielding elements in place.

Figure 3:
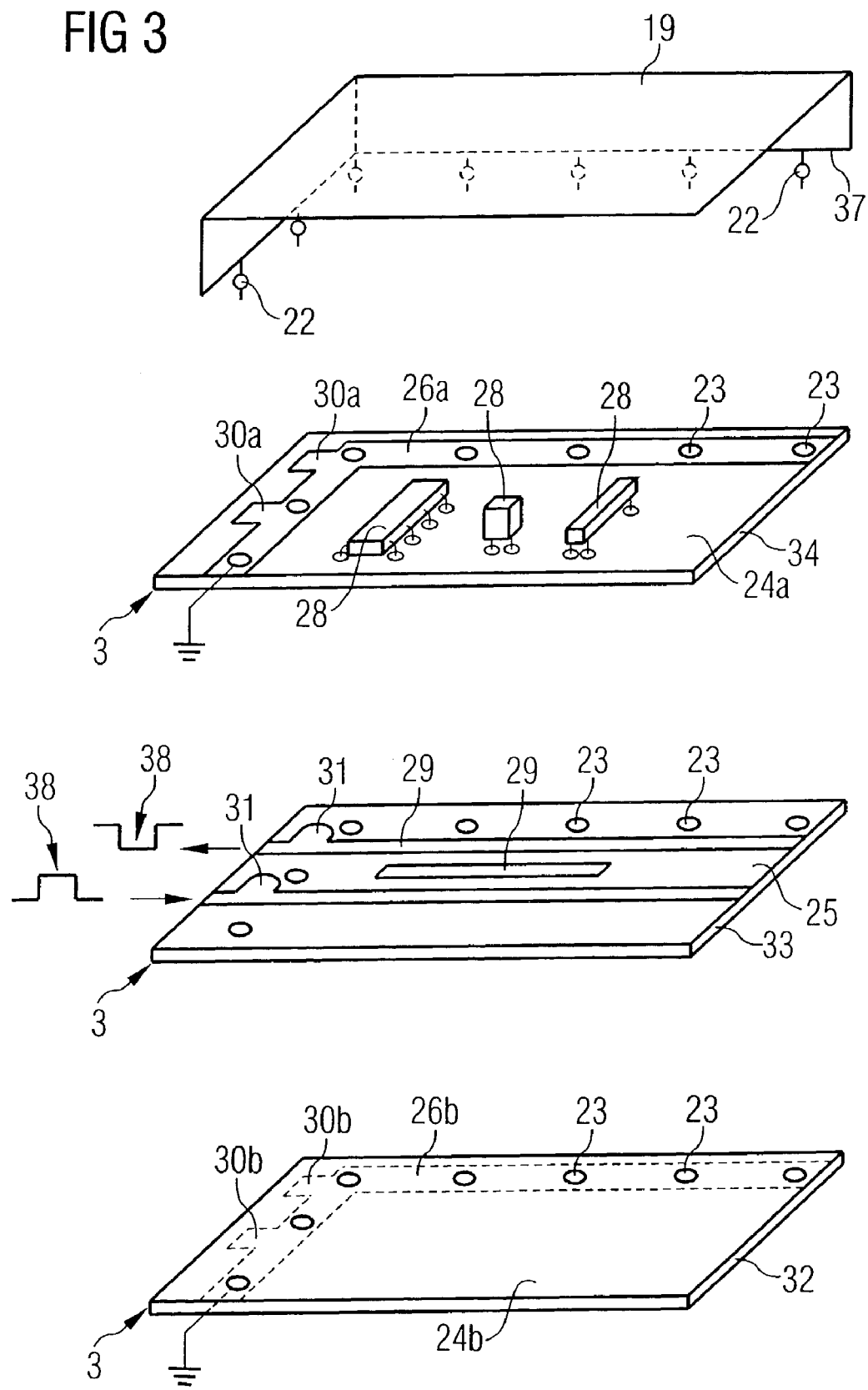
FIG. 3 is an exploded view of a the shielding element and various layers of the multilayer printed circuit board of FIG. 2.

FIG. 3 shows the grounded layers 24a, 24b and the signal-carrying layer 25 of the multilayer printed circuit board 3. The layers 24a, 24b, 25 comprise glass fiber-reinforced synthetic resin layers 32, 33, 34, on which electrical conductor tracks 26a, 26b, 29 are applied and which are joined together to form the multilayer printed circuit board 3. Electronic components 28 are arranged on the upper grounded layer 24. Electrical contact is made, through the upper layer 24a, between the electronic components 28 and the conductor tracks 29 on the signal-carrying layer 25. The conductor tracks 29 are used to transport measurement signals 38 on the signal-carrying layer 25 of the multilayer printed circuit board 3 and to supply the electronic components 28 with electric power. Capacitive conductor areas 30a, 30b, 31 are formed on the conductor tracks 26a, 26b, 29. The conductor areas 31 on the signal-carrying layer 25 are aligned with the conductor areas 30a, 30b of the grounded layers 24a, 24b, thereby forming a capacitor structure. The capacitance of the capacitor formed may be determined by selecting the size and the spacing of the aligned conductor areas 30a, 30b, 31. This capacitor filters out radio-frequency interference signals which proceed towards the shielded region via the conductor tracks 29.

Furthermore, a metallic shielding element 19 protects the sensitive electronic components 28 against influences due to electromagnetic radiation that is not transported on the conductor tracks 29. The shielding element 19 is connected to the multilayer printed circuit board 3 by latching mechanisms 22 which may, for example, be in the form of press-in contacts which are pressed into the cutouts 23. Electrical contact is made between the metallic shielding element 19 and the grounded conductor tracks 26 by placing the edge 37 of the shielding element 19 on the upper grounded conductor track 26 and/or by making contact between the latching mechanisms 22 and cutouts 23 which have been electrically plated-through to the grounded conductor tracks 26.

The position of the latching mechanisms 22 in relation to the conductor tracks 29 and the grounded conductor track 26 is selected such that, when the latching mechanisms 22 are inserted into the cutouts 23, an electrical contact is reliably created between the metallic shielding element 19 and the ground potential. Furthermore, an electrically conductive connection between the shielding element 19 and a conductor track 29 carrying a signal or a supply voltage is prevented.

Figure 4:
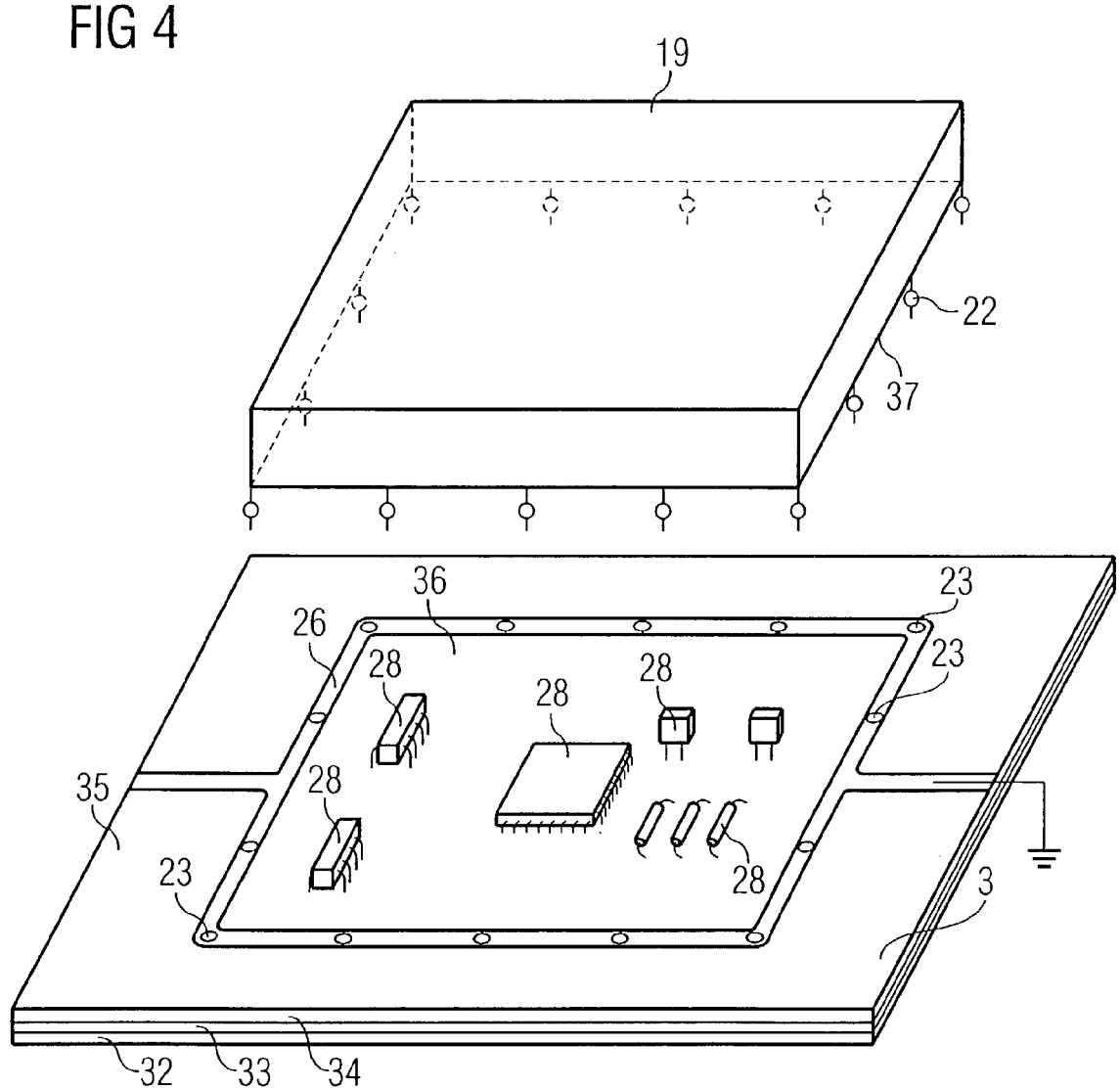
FIG. 4 is a perspective view of the multilayer printed circuit board having a region with no electromagnetic shielding and a shielded region.

FIG. 4 shows the multilayer printed circuit board 3 with a region 35 with no required electromagnetic shielding and a region 36 to be shielded. The shielded region 36 on the multilayer printed circuit board 3, which is formed from the glass fiber-reinforced synthetic resin layers 32, 33, 34, is separated off from the region 35 by a closed grounded conductor track 26. All of the electronic components 28 which are sensitive to interfering electromagnetic influences are arranged within the shielded region 36. The space above the shielded region 36 on the multilayer printed circuit board 3 is electromagnetically sealed off by the positioning of the metallic shielding element 19. For this purpose, the latching mechanisms 22, which may, for example, be press-in contacts are inserted, according to the invention, into the cutouts 23 which have been introduced into the multilayer printed circuit board 3 on the metallized surface of the grounded conductor track 26 and are pressed such that they are anchored securely in the cutouts 23. When the latching mechanisms 22 are pressed into the corresponding cutouts 23 cold welding occurs between the metallized layers in the cutouts 23 and the latching mechanisms 22 to ensure a reliable mechanical and electrical connection. The edge 37 of the shielding element 19 sits, when the shielding element 19 and the multilayer printed circuit board 3 are joined together, completely on the closed grounded conductor track 26. As a result, a completely electromagnetically shielded space is produced in which the sensitive electronic components 28 are located. An electrical and mechanical connection between the multilayer printed circuit board 3 and the shielding element 19 is made possible in only a single process step due to the latching elements 22 according to the invention on the shielding element 19 in connection with the corresponding cutouts 23 in the metallized region of the grounded conductor track 26 on the multilayer printed circuit board 3.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An electrical device, comprising:
   a mounting substrate on which electronic components are mounted, said mounting substrate comprising a multi-layer printed circuit board and having a conductor track structure for electrically interconnecting the electronic components;
   a boundary track of said conductor track structure on said mounting substrate having a surface and forming a boundary between a region on said mounting substrate to be shielded and a region on said mounting substrate with no shielding, at least one component of the electrical components is in the region to be shielded, the boundary track being connected to a fixed potential, at least one cutout being defined through a surface of said electrical conductor and into said mounting substrate;
   an electrically conductive shielding element positioned on said mounting substrate for shielding said at least one component against electromagnetic radiation, said shielding element having at least one latching mechanism in engagement with said at least one cutout, said engagement between said at least one mechanism and said at least one cutout connecting said shielding element to the fixed potential; and
   a filter device integrated into said printed circuit board, said filter device comprising a capacitor having a first conductor area formed by a first track of said conductor track structure and connected to a fixed first electrical potential and a second conductor area formed by a second track of said conductor track structure and connected to a second electric potential, said first and second conductor areas arranged in different layers of said multi-layer printed circuit board and opposing one another in said printed circuit board.

2. The electrical device of claim 1, wherein said at least one latching mechanism comprises a press-in contact that is pressed into the at least one cutout in said mounting substrate.

3. The electrical device of claim 1, wherein said at least one latching mechanism comprises a flexible pin that is pushed through said at least one cutout and bent back.

4. The electrical device of claim 3, wherein said at least one latching mechanism comprises a flat tab-shaped strip that is pushed through said at least one cutout and bent back.

5. The electrical device of claim 1, wherein said mounting substrate comprises a first part of the substrate that accommodates only components to be shielded, said first part comprising electrical and mechanical connecting elements, said first part being connectable to at least a second part of the substrate by said electrical and mechanical connecting elements.

6. The electrical device of claim 5, wherein said electrical and mechanical connecting elements are on one side of said first part of the substrate.

7. The electrical device of claim 1, wherein said mounting substrate comprises a first part of the substrate that accommodates only components to be shielded, said first part comprising electrical and mechanical connecting elements, said first part being connectable to at least a second part of the substrate by said electrical and mechanical connecting elements.

8. The electrical device of claim 7, wherein said electrical and mechanical connecting elements are on one side of said first part of the substrate.

9. The electrical device of claim 8, further comprising a device casing enclosing the entire mounting substrate and said shielding element, said device casing defining said mechanical connecting element.

10. The electrical device of claim 9, wherein said device casing is plastic.

11. The electrical device of claim 1, further comprising a device casing enclosing the entire mounting substrate and said shielding element.

12. The electrical device of claim 11, wherein said device casing is plastic.

13. The electrical device of claim 1, wherein said shielding element is arranged above said at least one component to be shielded and a further shielding element is arranged below said at least one component to be shielded.

14. The electrical device of claim 1, wherein said shielding element is arranged above said at least one component to be shielded and said mounting substrate comprises a metallized substrate for providing a shielding function below said at least one component.

15. The electrical device of claim 1, wherein at least one of said electronic components comprises a module having subcomponents, said conductor track structure connecting said subcomponents of said module and interconnecting said module to others of said electronic components.

16. The electrical device of claim 1, wherein said first track of said conductor track structure is said boundary track.

17. The electrical device of claim 16, wherein said boundary track is connected to a ground potential.

18. The electrical device of claim 16, further comprising a plurality of conductor tracks traversing the boundary between the region to be shielded and the region with no shielding, wherein a capacitance is formed between conductor areas on each of the plurality of conductor tracks and respective conductor areas on said boundary track.

19. The electrical device of claim 1, wherein said boundary track is connected to a ground potential.

* * * * *